(12) United States Patent
Radosavljevic et al.

(10) Patent No.: US 8,872,160 B2
(45) Date of Patent: Oct. 28, 2014

(54) INCREASING CARRIER INJECTION VELOCITY FOR INTEGRATED CIRCUIT DEVICES

(71) Applicant: Intel Corporation, Santa Clara, CA (US)

(72) Inventors: Marko Radosavljevic, Beaverton, OR (US); Benjamin Chu-Kung, Hillsboro, OR (US); Gilbert Dewey, Hillsboro, OR (US); Niloy Mukherjee, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/872,966

(22) Filed: Apr. 29, 2013

(65) Prior Publication Data

US 2013/0240838 A1 Sep. 19, 2013

Related U.S. Application Data

(63) Continuation of application No. 12/643,848, filed on Dec. 21, 2009, now Pat. No. 8,440,998.

(51) Int. Cl.
| | |
|---|---|
| *H01L 29/06* | (2006.01) |
| *H01L 29/80* | (2006.01) |
| *H01L 29/78* | (2006.01) |
| *H01L 29/778* | (2006.01) |
| *B82Y 10/00* | (2011.01) |
| *H01L 29/66* | (2006.01) |

(52) U.S. Cl.
CPC .......... *H01L 29/7783* (2013.01); *H01L 29/804* (2013.01); *H01L 29/7848* (2013.01); *H01L 29/7785* (2013.01); *B82Y 10/00* (2013.01); *H01L 29/66462* (2013.01); *H01L 29/7781* (2013.01); *H01L 29/778* (2013.01); *H01L 29/66431* (2013.01); *H01L 29/7782* (2013.01)
USPC ................................ 257/24; 257/29; 257/194

(58) Field of Classification Search
CPC .............. H01L 29/778; H01L 29/7781; H01L 29/7782; H01L 29/7785; H01L 29/804
USPC ............................................... 257/24, 29, 194
See application file for complete search history.

(56) References Cited

U.S. PATENT DOCUMENTS

| | | | |
|---|---|---|---|
| 5,783,478 A | 7/1998 | Chau et al. | |
| 6,373,112 B1 | 4/2002 | Murthy et al. | |

(Continued)

OTHER PUBLICATIONS

Awano, Y. et al., Performance and Principle of Operation of GaAs Ballistic Effect, 1983 IEEE, pp. 617-620.

(Continued)

*Primary Examiner* — David Vu
*Assistant Examiner* — Brandon Fox
(74) *Attorney, Agent, or Firm* — Schwabe, Williamson & Wyatt, P.C.

(57) ABSTRACT

Embodiments of the present disclosure describe structures and techniques to increase carrier injection velocity for integrated circuit devices. An integrated circuit device includes a semiconductor substrate, a first barrier film coupled with the semiconductor substrate, a quantum well channel coupled to the first barrier film, the quantum well channel comprising a first material having a first bandgap energy, and a source structure coupled to launch mobile charge carriers into the quantum well channel, the source structure comprising a second material having a second bandgap energy, wherein the second bandgap energy is greater than the first bandgap energy. Other embodiments may be described and/or claimed.

20 Claims, 7 Drawing Sheets

(56) References Cited

U.S. PATENT DOCUMENTS

| | | |
|---|---|---|
| 6,570,194 B2 * | 5/2003 | Kato et al. .................. 257/194 |
| 6,621,131 B2 | 9/2003 | Murthy et al. |
| 6,645,831 B1 | 11/2003 | Shaheen et al. |
| 6,797,556 B2 | 9/2004 | Murthy et al. |
| 6,812,086 B2 | 11/2004 | Murthy et al. |
| 6,825,506 B2 | 11/2004 | Jin et al. |
| 6,858,478 B2 | 2/2005 | Chau et al. |
| 6,861,318 B2 | 3/2005 | Murthy et al. |
| 6,885,084 B2 | 4/2005 | Murthy et al. |
| 6,887,395 B2 | 5/2005 | Hareland et al. |
| 6,897,098 B2 | 5/2005 | Hareland et al. |
| 6,900,481 B2 | 5/2005 | Jin et al. |
| 6,909,151 B2 | 6/2005 | Hareland et al. |
| 6,914,295 B2 | 7/2005 | Chau et al. |
| 6,933,589 B2 | 8/2005 | Murthy et al. |
| 6,972,228 B2 | 12/2005 | Doyle et al. |
| 6,974,733 B2 | 12/2005 | Boyanov et al. |
| 6,974,738 B2 | 12/2005 | Hareland et al. |
| 7,005,366 B2 | 2/2006 | Chau et al. |
| 7,042,009 B2 | 5/2006 | Shaheen et al. |
| 7,105,390 B2 | 9/2006 | Brask et al. |
| 7,138,316 B2 | 11/2006 | Jin et al. |
| 7,145,246 B2 | 12/2006 | Hareland et al. |
| 7,176,075 B2 | 2/2007 | Jin et al. |
| 7,180,109 B2 | 2/2007 | Jin et al. |
| 7,193,279 B2 | 3/2007 | Doyle et al. |
| 7,235,809 B2 | 6/2007 | Jin et al. |
| 7,241,653 B2 | 7/2007 | Hareland et al. |
| 7,268,058 B2 | 9/2007 | Jin et al. |
| 7,279,375 B2 | 10/2007 | Radosavljevic et al. |
| 7,285,829 B2 | 10/2007 | Doyle et al. |
| 7,358,121 B2 | 4/2008 | Chau et al. |
| 7,429,747 B2 | 9/2008 | Hudait et al. |
| 7,435,683 B2 | 10/2008 | Kavalieros et al. |
| 7,435,987 B1 | 10/2008 | Chui et al. |
| 7,566,898 B2 | 7/2009 | Hudait et al. |
| 7,569,869 B2 | 8/2009 | Jin et al. |
| 7,601,980 B2 | 10/2009 | Hudait et al. |
| 2004/0113210 A1 | 6/2004 | Chau et al. |
| 2004/0191980 A1 | 9/2004 | Rios et al. |
| 2005/0124125 A1 | 6/2005 | Jin et al. |
| 2007/0123003 A1 | 5/2007 | Brask et al. |
| 2008/0029756 A1 | 2/2008 | Hudait et al. |
| 2008/0032478 A1 | 2/2008 | Hudait et al. |
| 2008/0073639 A1 | 3/2008 | Hudait et al. |
| 2008/0076235 A1 | 3/2008 | Hudait et al. |
| 2008/0079094 A1 | 4/2008 | Jin et al. |
| 2008/0085580 A1 | 4/2008 | Doyle et al. |
| 2008/0132081 A1 | 6/2008 | Shaheen et al. |
| 2008/0142785 A1 | 6/2008 | Datta et al. |
| 2008/0142786 A1 | 6/2008 | Datta et al. |
| 2008/0169512 A1 | 7/2008 | Jin et al. |
| 2008/0203381 A1 | 8/2008 | Hudait et al. |
| 2008/0237573 A1 | 10/2008 | Jin et al. |
| 2008/0237575 A1 | 10/2008 | Jin et al. |
| 2008/0237577 A1 | 10/2008 | Chui et al. |
| 2008/0237719 A1 | 10/2008 | Doyle et al. |
| 2008/0237751 A1 | 10/2008 | Shah et al. |
| 2009/0001350 A1 | 1/2009 | Hudait et al. |
| 2009/0001441 A1 | 1/2009 | Jin et al. |
| 2009/0085062 A1 | 4/2009 | Jin et al. |
| 2009/0230478 A1 | 9/2009 | Pillarisetty et al. |

OTHER PUBLICATIONS

Tomizawa, K. et al., Simulation of GaAs Submicron FET with Hot-Electron Injection Structure, Electronics Letters, Aug. 18, 1983, Vo. 19 No. 17, pp. 697-698.

Yamasaki, K et al., Electron Velocity Enhancement by Planar-Doped Barrier Source in GaAs Vertical FET, Electronics Letters, Oct. 27, 1988, vol. 24 No. 22, pp. 1383-1384.

Weinzierl, Steven R. et al., Heterojunction Vertical FET's Revisited: Potentional for 225-GHz Large-Current Operation, IEEE Transaction on Electron Devices, vol. 39, No. 5, May 1992, pp. 1050-1055.

Cea, S.M. et al., Front End Stress Modeling for Advance Logic Technologies, IEEE, 2004, pp. 963-966.

Giles, M.D. et al., Understanding Stress Enhanced Performance in Intel 90nm CMOS Technology, IEEE, 2004 Symposium on VLSI Technology Digest of Technical Papers, pp. 118-119.

Obradovic, B. et al., A Physically-Based Analytic Model for Stress-Induced Hole Mobility Enhancement, IEEE, 2004, pp. 26-27.

Shifren, L. et al., Drive current enhancement in p-type metal-oxide-semiconductor field-effect transistor under shear uniaxial stress, Applied Physics Letters, vol. 85, No. 25, Dec. 20, 2004, pp. 6188-6190.

Wang, Everett X. et al., Physics of Hole Transport in Strained Silicon MOSFET inversion Layers, IEEE Transaction on Electron Devices, vol. 53, No. 8, Aug. 2006, pp. 1840-1851.

\* cited by examiner

INCREASING CARRIER INJECTION VELOCITY FOR INTEGRATED CIRCUIT DEVICES

CROSS-REFERENCE TO RELATED APPLICATION

This application claims priority to U.S. patent application Ser. No. 12/643,848, entitled "Increasing Carrier Injection Velocity for Integrated Circuit Devices," filed Dec. 21, 2009. The application is hereby incorporated by reference herein in its entirety for all purposes.

FIELD

Embodiments of the present disclosure generally relate to the field of integrated circuits, and more particularly, to structures and techniques to increase carrier injection velocity for integrated circuit devices.

BACKGROUND

Generally, integrated circuit devices such as transistors are being formed on emerging semiconductor thin films such as, for example, group III-V semiconductor materials for electronic or optoelectronic devices. Lower carrier velocities at a gate region of an integrated circuit device may result in a lower aggregate carrier velocity through a channel of the integrated circuit device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide techniques and configurations for increasing carrier injection velocity for integrated circuit devices such as horizontal field effect transistors. In the following detailed description, reference is made to the accompanying drawings which form a part hereof wherein like numerals designate like parts throughout, and in which is shown by way of illustration embodiments which may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description may use perspective-based descriptions such as horizontal/vertical, up/down, back/front, over/under, and top/bottom. Such descriptions may not restrict the application of embodiments described herein to a particular orientation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled" may be used to describe various relationships between components herein. For example, the term "coupled to" may generally refer to a more direct physical connection between components, unless otherwise expressed (e.g., "electrically coupled," "communicatively coupled," or "coupled to [perform a function]"). The term "coupled with" generally refers to a physical connection where other intervening components may or may not be present between such coupled components.

Figure 1:
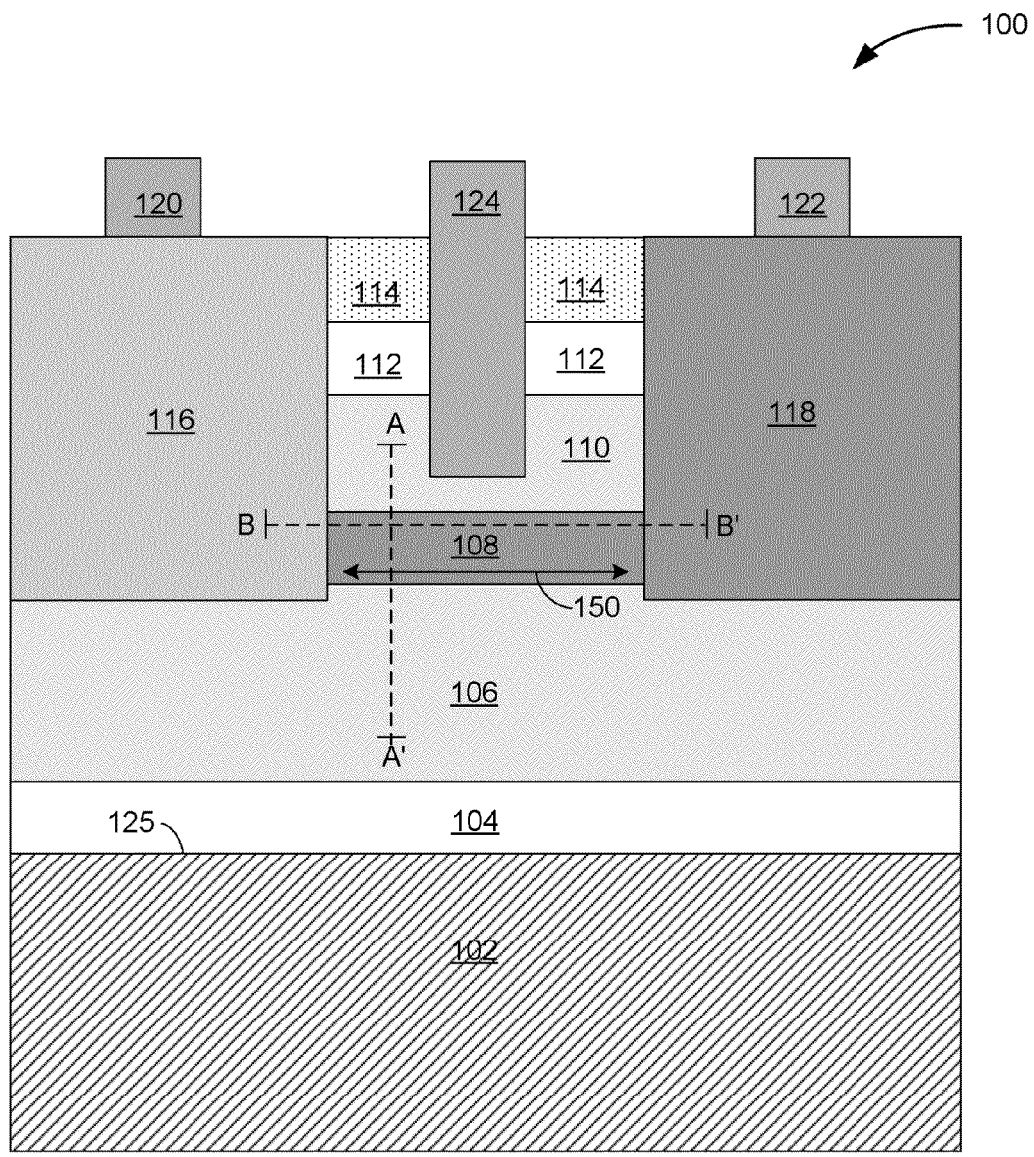
FIG. 1 schematically illustrates an example integrated circuit device to increase carrier injection velocity in accordance with some embodiments.

FIG. 1 schematically illustrates an example integrated circuit device 100 to increase carrier injection velocity in accordance with some embodiments. In an embodiment, the integrated circuit device 100 includes a semiconductor substrate 102, one or more buffer films 104, a first barrier film 106, a quantum well channel 108, a second barrier film 110, an etch stop film 112, a contact film 114, a source structure 116, a drain structure 118, a source electrode 120, a drain electrode 122, and a gate electrode 124, coupled as shown.

The semiconductor substrate 102 may include N-type or P-type (100) off-oriented silicon, the crystalline directions of the semiconductor substrate 102 being symbolized by the convention (xyz), where x, y, and z represent respective crystallographic planes in three dimensions that are perpendicular to one another. The semiconductor substrate 102 may, for example, include material of a (100) direction off-cut in a range between about 2 degrees to about 8 degrees towards a (110) direction. Other off-cut orientations or a substrate 102 without an off-cut orientation may be used. Off-cutting may eliminate anti-phase boundaries.

The semiconductor substrate 102 may have a high resistivity between about 1 Ω-cm to about 50 kΩ-cm. High resistivity may allow for device isolation of one or more integrated circuit devices (e.g., integrated circuit device 100) formed on an active surface 125 of the semiconductor substrate 102. The active surface 125 may be a substantially planar surface upon which integrated circuit devices (e.g., integrated circuit device 100) such as transistors are formed.

One or more buffer films 104 may be coupled to the semiconductor substrate 102. In an embodiment, the one or more buffer films 104 include a nucleation buffer film (not shown) and a graded buffer film (not shown). The nucleation buffer film may be used, for example, to fill semiconductor substrate 102 terraces with atomic bi-layers of a semiconductor material including, for example, one or more group III-V semiconductor materials and/or one or more group II-VI semiconductor materials, or combinations thereof. A nucleation portion (not shown) of the nucleation buffer film may create a virtual polar semiconductor substrate 102. Such nucleation portion may, for example, have a thickness of about 3 nanometers (nm) to about 50 nm. A buffer film portion (not shown) of the nucleation buffer film may serve as a buffer against dislocation threading and/or provide control of a lattice mismatch of about 4% to about 8% between the semiconductor substrate 102 and the first barrier film 106. The buffer film portion of nucleation buffer film may, for example, have a thickness of about 0.3 microns to about 5 microns. The nucleation buffer film (e.g., the one or more buffer films 104) may include group III-V semiconductors and/or group II-VI semiconductors, such as gallium arsenide (GaAs). Other material systems may be used to form the nucleation buffer film including N-type or P-type material systems.

The one or more buffer films 104 may further include a graded buffer film (not shown) formed on the nucleation buffer film (not shown). The graded buffer film may include, for example, group III-V semiconductor materials and/or group II-VI semiconductor materials, or combinations thereof. For example, the graded buffer film may include indium aluminum arsenide ($In_xAl_{1-x}As$), where x has a value between 0 and 1, representing the relative composition of the elements. In one embodiment, x has a value between about 0 and about 0.52. In another embodiment, the graded buffer film includes indium aluminum antimonide (InAlSb).

Other material systems including N-type or P-type materials may be used for the graded buffer film in other embodiments. For example, the graded buffer film may include inverse graded InAlAs or indium gallium aluminum arsenide (InGaAlAs) to provide a larger bandgap for device isolation. Increasing the relative percentage of aluminum (Al) in the graded buffer film in such a material system may strategically increase strain (e.g., compressive strain) to the quantum well channel 108 to increase performance of the integrated circuit device 100.

The graded buffer film may also provide stress relaxation between the semiconductor substrate 102 and other lattice mismatched films, such as, for example, the first barrier film 106, to reduce threading dislocation defects in the integrated circuit device 100. The graded buffer film may, for example, have a thickness of about 0.5 microns to 2 microns. Other thicknesses may be used in other embodiments. The one or more buffer films 104 may include other buffer films, or techniques that provide similar function as described herein in other embodiments.

The one or more buffer films 104 may be epitaxially deposited. In an embodiment, the one or more buffer films are deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A first barrier film 106 may be coupled with the semiconductor substrate 102. For example, the first barrier film 106 may be coupled to the one or more buffer films 104 formed on the semiconductor substrate 102, as illustrated. The first barrier film 106 may include group III-V semiconductor materials and/or group II-VI semiconductor materials, or combinations thereof. In an embodiment, the first barrier film 106 includes indium aluminum arsenide ($In_xAl_{1-x}As$), where x has a value between 0 and 1, representing the relative composition of the elements. According to various embodiments, x has a value between about 0.5 and about 0.8. In another embodiment, the first barrier film 106 includes indium aluminum antimonide (InAlSb). In yet another embodiment, the first barrier film 106 includes indium phosphide (InP). Other material systems including N-type materials and/or P-type materials may be used for the first barrier film 106 in other embodiments.

The first barrier film 106 may include a material that has a higher bandgap than a material used for the quantum well channel 108. A thickness for the first barrier film 106 may be selected to provide a sufficient barrier to charge carriers in the quantum well channel 108. In an embodiment, the first barrier film 106 has a thickness of about 10 nm to about 200 nm. Other thicknesses for the first barrier film 106 may be used in other embodiments.

The first barrier film 106 may be epitaxially deposited. In an embodiment, the first barrier film 106 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A quantum well channel 108 may be coupled to the first barrier film 106. The quantum well channel 108 may include group III-V semiconductor materials and/or group II-VI semiconductor materials, or combinations thereof. In an embodiment, the quantum well channel 108 includes indium gallium arsenide ($In_xGa_{1-x}As$), where x has a value between 0 and 1, representing the relative composition of the elements. In an embodiment, x includes values between about 0.5 and about 0.8. In another embodiment, the quantum well channel 108 includes indium antimonide (InSb). The quantum well channel 108 may include various other material systems including N-type or P-type materials in other embodiments. The quantum well channel 108 provides a pathway for mobile charge carriers such as electrons or holes to move between a source structure 116 and a drain structure 118. According to various embodiments, the quantum well channel 108 provides electron mobility for N-type devices and/or provides hole mobility for P-type devices.

Figure 2:
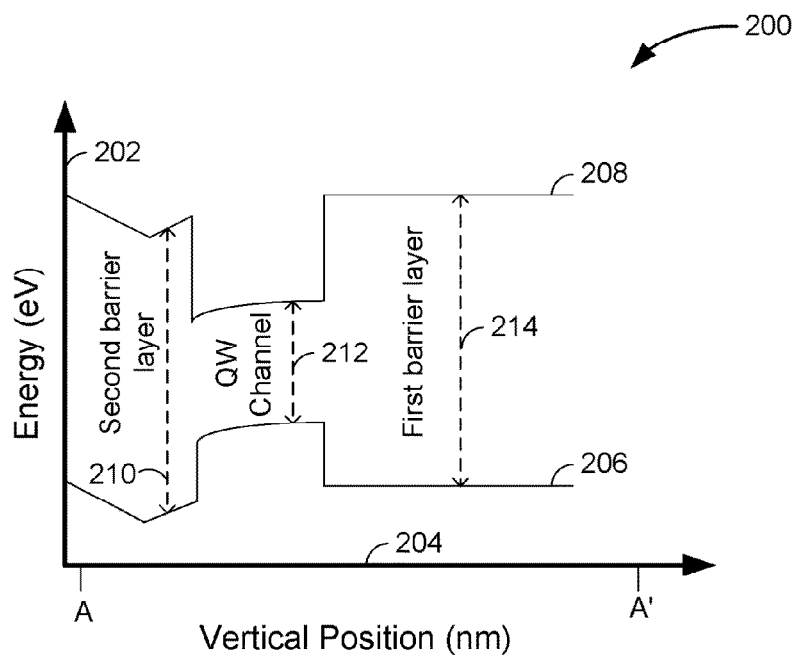
FIG. 2 provides a band gap energy diagram through a vertical direction of an integrated circuit device in accordance with some embodiments.

According to various embodiments, the quantum well channel 108 has a band gap energy that is relatively smaller than a band gap for the first barrier film 106 and the second barrier film 110 (See, e.g., FIG. 2). The quantum well channel 108 may have a thickness that provides channel conductance for the integrated circuit device 100. According to various embodiments, the quantum well channel 108 has a thickness of about 2 nm to about 15 nm. The quantum well channel 108 may have other thicknesses in other embodiments.

The quantum well channel 108 may be epitaxially deposited. In an embodiment, the quantum well channel 108 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A source structure 116 is coupled to launch mobile charge carriers (e.g., electrons or holes) into the quantum well channel 108. According to various embodiments, the source structure 116 includes a material having a band gap energy that is greater than a band gap energy of a material used to form the quantum well channel 108. The source structure 116 having a relatively wider band gap energy coupled to the quantum well channel 108 having a relatively narrower band gap energy provides a ballistic launcher to inject mobile charge carriers from the source structure into the quantum well channel 108 with a non-zero kinetic energy. A band gap for the source structure 116 may be selected to provide a desired or sufficient conductivity and/or epitaxial connection with the quantum well channel 108 according to well-known band-gap engineering principles.

The source structure 116 may be epitaxially coupled to the quantum well channel 108 to form a heterojunction between the source structure 116 and the quantum well channel 108 to increase an injection velocity of the mobile charge carriers from the source structure 116 into the quantum well channel 108. Increasing the velocity of the mobile charge carriers may improve direct current (DC) and radio frequency (RF) characteristics of the integrated circuit device 100 and may decrease an amount of time for the mobile charge carriers to reach a peak velocity in the quantum well channel 108, mitigating issues of low acceleration of the mobile charge carriers.

The source structure 116 may be coupled to horizontally inject the mobile charge carriers into the quantum well channel 108. For example, a ballistic launcher formed by the source structure 116 and the quantum well channel 108 may increase an injection velocity of the mobile charge carriers in a direction that is substantially parallel with a direction (e.g., arrow 150) of current flow in the quantum well channel 108. The direction indicated by arrow 150 may be a longitudinal direction of the quantum well channel 108. A horizontal direction may refer to a direction (e.g., 150) that is substantially parallel with the active surface (e.g., 125) of the semiconductor substrate 102. That is, the ballistic launcher may increase an injection velocity of the mobile charge carriers in a direction that is substantially parallel with the active surface (e.g., 125) of the semiconductor substrate or substantially parallel with a longitudinal direction of the quantum well channel 108. According to various embodiments, the integrated circuit device 100 is a horizontal field-effect transistor, or a high electron mobility transistor, or combinations thereof. The integrated circuit device 100 may include other types of transistors that benefit from embodiments described herein, including non-planar transistors such as multi-gate transistors. The integrated circuit device 100 may be a transistor having a gate length of about 15 nm. Other gate lengths may be used in other embodiments.

The source structure 116 may be formed using a variety of materials including group III-V semiconductor materials and/or group II-VI semiconductor materials, or combinations thereof. In an embodiment, the source structure 116 includes gallium arsenide (GaAs). In another embodiment, the source structure 116 includes indium aluminum arsenide (InAlAs). According to various embodiments, the source structure 116 has a thickness of less than about 60 nm. The source structure 116 may have other thicknesses in other embodiments. In an embodiment, the source structure 116 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A drain structure 118 may be coupled to receive the mobile charge carriers from the quantum well channel 108. According to various embodiments, the drain structure 118 includes a material having a band gap energy that is equal to or less than a band gap energy of a material used to form the quantum well channel 108. A band gap energy for the drain structure 118 that is equal to or less than a band gap energy for the quantum well channel 108 may facilitate increased mobility of the mobile charge carriers in the quantum well channel 108.

The drain structure 118 may be formed using a variety of materials including group III-V semiconductor materials and/or group II-VI semiconductor materials, or combinations thereof. In an embodiment, the drain structure 118 includes indium gallium arsenide (InGaAs). In another embodiment, the drain structure 118 includes indium antimonide (InSb). According to various embodiments, the drain structure 118 has a thickness of less than about 60 nm. The drain structure 118 may have other thicknesses in other embodiments. The drain structure 118 may be epitaxially deposited. In an embodiment, the drain structure 118 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

The source structure 116 and/or the drain structure 118 may be doped with an impurity, according to various embodiments. For example, the source structure 116 and/or the drain structure 118 may be delta-doped, modulation doped and/or combinations thereof. For an N-type device, the source structure 116 and/or the drain structure 118 may be doped with silicon (Si), sulfur (S), tellurium (Te), or combinations thereof. For a P-type device, the source structure 116 and/or the drain structure 118 may be doped with beryllium (Be), carbon (C), or combinations thereof. Other impurities may be used to dope the source structure 116 and/or the drain structure 118 in other embodiments. In an embodiment, the quantum well channel 108 may be un-doped while the source structure 116 and/or the drain structure 118 are doped to create an N-type or P-type device. In such embodiment, the undoped quantum well-channel 108 may be a channel of the N-type or P-type device.

A second barrier film 110 may be coupled to the quantum well channel 108 to provide confinement for mobile charge carriers when they travel in the quantum well channel 108. The second barrier film 110 may comport with embodiments already described in connection with the first barrier film 110 including material types, thicknesses, and/or deposition techniques. According to various embodiments, the second barrier film 110 is a Schottky barrier layer for control of the quantum well channel 108 using the gate electrode 124. In an embodiment, the quantum well channel 108 is disposed between the first barrier film 110 and the second barrier film 110, as illustrated.

An etch stop film 112 may be coupled with the second barrier film 110. The etch stop film 112 may be used to facilitate formation of the gate electrode 124. The etch stop film 112 may include group III-V semiconductor materials and/or group II-VI semiconductor materials, or combinations thereof, including, for example, indium phosphide (InP), InAlSb, or suitable combinations thereof. Other material systems including N-type materials and/or P-type materials may be used for the etch stop film 112 in other embodiments.

In an embodiment, the etch stop film 112 has a thickness of about 2 nm to 15 nm. Other thicknesses for the etch stop film 112 may be used in other embodiments. In an embodiment, the etch stop film 112 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A contact film 114 may be coupled with the etch stop film 112. The contact film 114 may include group III-V semiconductor materials and/or group II-VI semiconductor materials, or combinations thereof, including, for example, InGaAs. Other material systems including N-type materials and/or P-type materials may be used for the contact film 114 in other embodiments. The contact film 114 may be doped to increase electrical conductivity of the contact film 114. For example, the contact film 114 may be delta-doped, modulation doped and/or combinations thereof. For an N-type device, the contact film 114 may be doped with silicon (Si), sulfur (S), tellurium (Te), or combinations thereof. For a P-type device, the contact film 114 may be doped with beryllium (Be), carbon (C), or combinations thereof. Other impurities may be used to dope the contact film 114 in other embodiments. Other structures described herein may be doped according to similar principles to affect conductivity.

In an embodiment, the contact film 114 has a thickness of about 5 to 50 nm. Other thicknesses of the contact film 114 may be used in other embodiments. In an embodiment, the contact film 114 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments. The integrated circuit device 100 may include other films and structures such as, for example, spacer films, doped films, other barrier films, and/or strain-inducing films, which may intervene between structures and features described herein, according to various embodiments.

A source electrode 120 and a drain electrode 122 may be coupled to the respective source structure 116 and the drain structure 122. A gate electrode 124 may be coupled to control the flow of mobile charge carriers in the quantum well channel 108. According to various embodiments, a gate dielectric (not shown) may be formed between the gate electrode 124 and the quantum well channel 108. The gate dielectric may include, for example silicon oxide ($SiO_2$), silicon oxynitride ($SiO_xN_y$), silicon nitride ($Si_xN_y$) aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), or combinations thereof, where x, y, and z represent suitable quantities of the respective elements. Other materials may be used in other embodiments for the gate dielectric.

The contact film 114 may be electrically insulated or isolated from the gate electrode 124 by a variety of techniques, including, for example, recessing the contact film 114 to form an air gap or depositing a spacer dielectric material between the gate electrode 124 and the contact film 114. In an embodiment, the second barrier film 110 is a Schottky barrier layer for the gate electrode 124 to provide a Schottky junction through which the gate electrode 124 may control the quantum well channel 108.

The gate electrode 124, the source electrode 120, and the drain electrode 122 may include a wide variety of suitable electrically conductive materials. For example, the electrodes 120, 122, 124 may include copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof. The electrodes 120, 122, 124 may include a metal nitride such as, for example, titanium nitride (TiN), tungsten nitride (WN), or tantalum nitride (TaN), or combinations thereof. The electrodes 120, 122, 124 may include a metal silicide such as, for example, titanium silicide (TiSi), tungsten silicide (WSi), tantalum silicide (TaSi), cobalt silicide (CoSi), platinum silicide (PtSi), nickel silicide (NiSi), or combinations thereof. The electrodes 120, 122, 124 may include a metal silicon nitride such as, for example, titanium silicon nitride (TiSiN), or tantalum silicon nitride (TaSiN), or combinations thereof. The electrodes 120, 122, 124 may include a metal carbide such as, for example, titanium carbide (TiC), zirconium carbide (ZrC), tantalum carbide (TaC), hafnium carbide (HfC), or aluminum carbide (AlC), or combinations thereof. The electrodes 120, 122, 124 may include a metal carbon nitride such as, for example, tantalum carbon nitride (TaCN), titanium carbon nitride (TiCN), or combinations thereof. Other suitable materials may be used in other embodiments for the electrodes 120, 122, 124 such as conductive metal oxides (e.g., ruthenium oxide).

FIG. 2 provides a band gap energy diagram 200 through a vertical direction (e.g., from A to A') of the integrated circuit device 100. A vertical axis 202 represents increasing energy in electron-volts (eV) in the direction of the vertical axis arrow and a horizontal axis 204 represents vertical position through the integrated circuit device 100 in nanometers (nm). A valence band energy 206 and a conduction band energy 208 for materials between position A and position A' of the integrated circuit device 100 are depicted. As illustrated, a band gap energy 210 of the second barrier film (e.g., 110) is greater than a band gap energy 212 of the quantum well channel (e.g., 108) and a band gap energy 214 of the first barrier film (e.g., 106) is greater than the band gap energy 212 of the quantum well channel (e.g., 108). The first barrier film (e.g., 106) and the second barrier film (e.g., 110) may be doped with an impurity to provide confinement of mobile charge carriers to the quantum well channel (e.g., 108).

Figure 3:
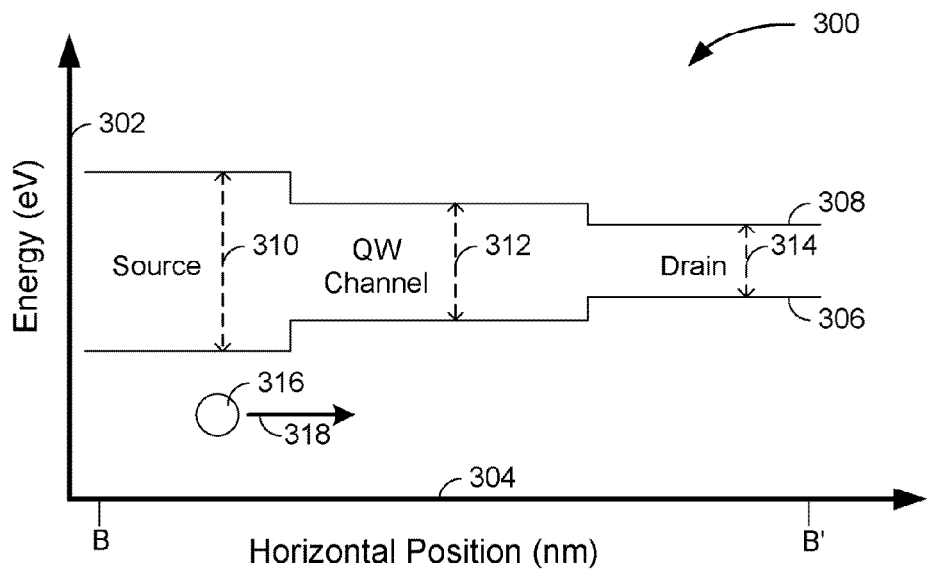
FIG. 3 provides a band gap energy diagram through a horizontal direction of an integrated circuit device in accordance with some embodiments.

Turning to FIG. 3, a band gap energy diagram 300 is provided through a horizontal direction (e.g., from B to B') of the integrated circuit device 100 in accordance with some embodiments. A vertical axis 302 represents increasing energy (eV) in the direction of the vertical axis arrow and a horizontal axis 304 represents a horizontal position (e.g., from B to B') in the integrated circuit device 100. A valence band energy 306 and a conduction band energy 308 are depicted for a source structure (e.g., 116), a quantum well channel (e.g., 108), and a drain structure (e.g., 118).

As illustrated, a band gap energy 310 of the source structure (e.g., 116) is greater than a band gap energy 312 of the quantum well channel (e.g., 108) forming a band gap discontinuity between the source structure and the quantum well channel. The lower valence band energy 306 relative to the conduction band energy 308 of the band gap energy 310 of the source structure (e.g., 116) may create a higher energy state for mobile charge carriers (e.g., 316) in the source structure. Thus, when mobile charge carriers travel (e.g., arrow 318) from the source structure (e.g., 116) to the quantum well channel (e.g., 108), the mobile charge carriers may be injected with an initially higher energy, which is converted from potential energy into kinetic energy, ballistically launching the mobile charge carriers into the quantum well channel. An energy difference between the band gap energies 310 and 312 may represent an additional kinetic energy (e.g., increased velocity) of the mobile charge carriers as they travel from the source structure (e.g., 116) into the quantum well channel (e.g., 108).

As illustrated, a band gap energy 314 of the drain structure (e.g., 118) is less than the band gap energy 312 of the quantum well channel (e.g., 108). In other embodiments, the band gap energy 314 of the drain structure (e.g., 118) is substantially equal to the band gap energy 312 of the quantum well channel (e.g., 108).

Figure 4:
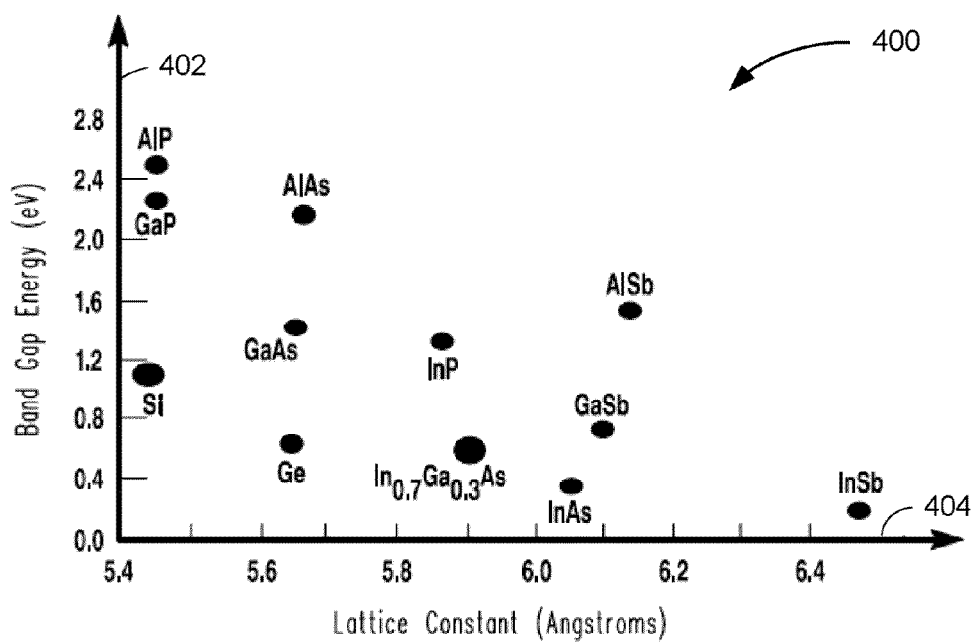
FIG. 4 provides a diagram of band gap energy and lattice constant for some example semiconductor materials in accordance with some embodiments.

Turning to FIG. 4, a diagram 400 is provided to illustrate a band gap energy and a lattice constant for some example semiconductor materials in accordance with some embodiments. The band gap energy (eV) is depicted on a vertical axis 402 and a lattice constant (Angstroms) is depicted on a horizontal axis 404. The diagram 400 depicts some example semiconductor materials for visual comparison of respective band gap energies and lattice constants. For example, points are illustrated on the diagram 400 for indium antimonide (InSb), indium arsenide (InAs), indium gallium arsenide (InGaAs), germanium (Ge), gallium antimonide (GaSb), silicon (Si), indium phosphide (InP), gallium arsenide (GaAs), aluminum antimonide (AlSb), aluminum arsenide (AlAs), gallium phosphide (GaP), and aluminum phosphide (AlP). Materials for structures and features described herein may be selected to provide a desired or sufficient conductivity and/or epitaxial connection relative to adjacent structures and features according to well-known band-gap engineering principles.

The example semiconductor materials depicted in the diagram 400 are not intended to be an exhaustive representation of materials that can be used to form structures described herein. A wide variety of suitable materials, many of which may not be illustrated in the diagram 400, can be used to form structures described herein, including other combinations of the elements and compounds depicted in diagram 400.

Figure 5:
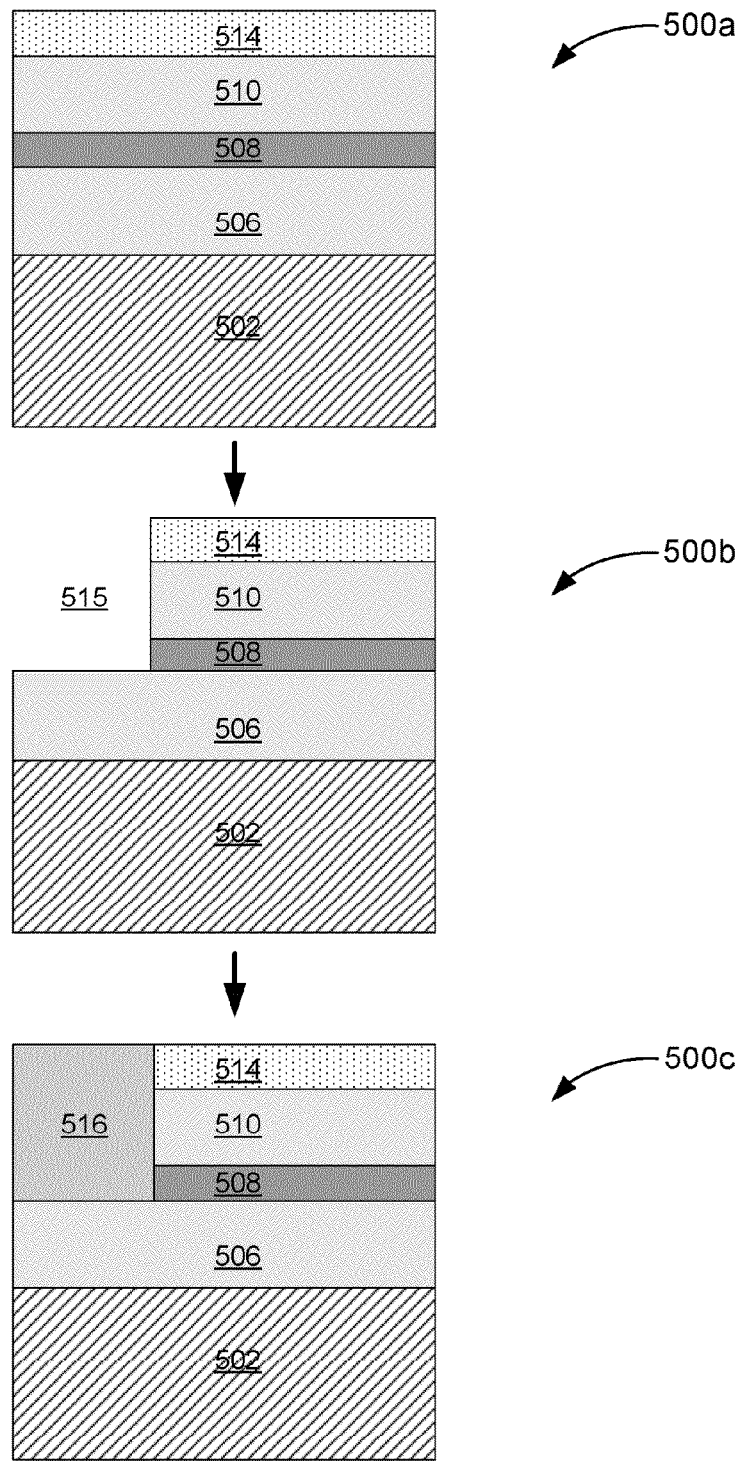
FIG. 5 schematically illustrates formation of a source structure in a semiconductor heterostructure after various process operations in accordance with some embodiments.

FIG. 5 schematically illustrates formation of a source structure 516 in a semiconductor heterostructure 500a after various process operations in accordance with some embodiments. A semiconductor heterostructure 500a may be formed according to various techniques described herein. A first barrier film 506 may be formed and coupled with a semiconductor substrate 502. For example, the first barrier film 506 may be deposited on the semiconductor substrate 502 or on one or more buffer films (e.g., 104) formed on the semiconductor substrate 502.

A material for quantum well channel 508 may be deposited on or over the first barrier film 506, followed by deposition of a material for the second barrier film 510 on or over the quantum well channel 508. A contact film 514 may be deposited on or over the second barrier film 510 to form the semiconductor heterostructure 500a. The semiconductor heterostructure 500a may include other films and/or structures, including films described herein (e.g., etch stop film 112 of the integrated circuit device 100), that are omitted in FIG. 5 for the sake of clarity. The films 506, 510, 514, and the quantum well channel 508 may be epitaxially deposited.

In manufacturing product 500b, portions of the semiconductor heterostructure 500a are selectively removed to form a first recessed region 515. In an embodiment, portions of at least the contact film 514, the second barrier film 510, and the quantum well channel 508 are removed to form the first recessed region 515. In another embodiment, portions of the semiconductor heterostructure 500a are selectively removed prior to deposition of the contact film 514. In such embodiment, portions of at least the second barrier film 510 and the quantum channel 508 are removed to form the first recessed region 515. The contact film 514 may be subsequently deposited subsequent to formation of the first recessed region 515 according to various embodiments.

In an embodiment, the first recessed region 515 is formed by an etching process. Other processes such as lithography or other patterning processes may be used to selectively remove portions of the semiconductor heterostructure 500a to form the first recessed region 515 in the manufacturing product 500b.

In manufacturing product 500c, a material is deposited to form the source structure 516 in the first recessed region 515. The material of the source structure 516 may have a bandgap energy that is greater than a bandgap energy of the material of the quantum well channel 508. According to various embodiments, the source structure 516 is epitaxially deposited to form a heterojunction between the source structure 516 and the quantum well channel 508.

Figure 6:
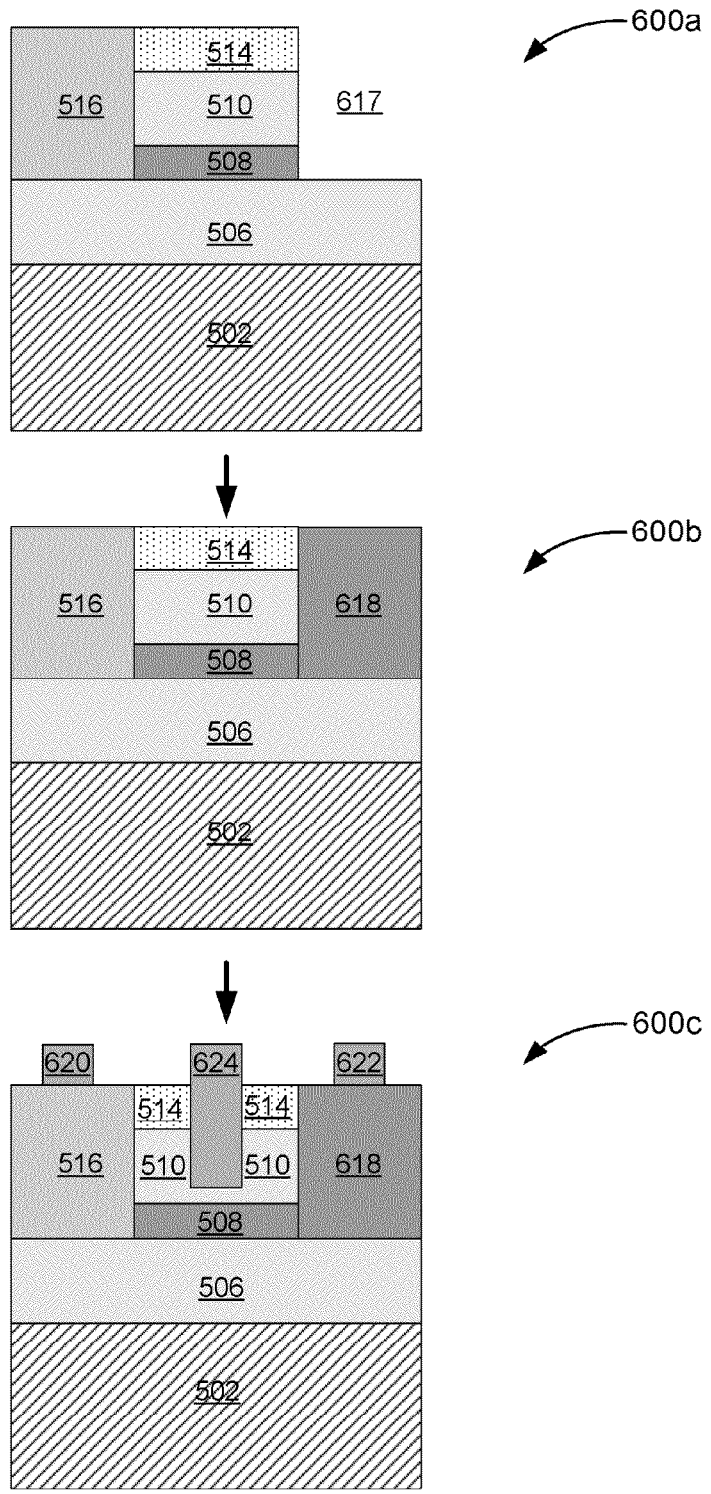
FIG. 6 schematically illustrates formation of a drain structure and electrode structures in a semiconductor heterostructure after various process operations in accordance with some embodiments.

FIG. 6 schematically illustrates formation of a drain structure 618 and electrode structures (e.g., 620, 622, 624) in a semiconductor heterostructure (e.g., 500a) after various process operations in accordance with some embodiments. Manufacturing product 600a represents the manufacturing product 500c of FIG. 5 after selective removal of portions of the contact film 514, the second barrier film 510, and the quantum well channel 508 to form a second recessed region 617. The second recessed region 617 may be formed by patterning techniques including, for example, etch and/or lithography processes.

In manufacturing product 600b, a material is deposited to form the drain structure 618 in the second recessed region 617. The material of the drain structure 618 may have a bandgap energy that is equal to or less than a bandgap energy of the material of the quantum well channel 508. According to various embodiments, the drain structure 516 is epitaxially deposited.

In manufacturing product 600c, a source electrode 620, a drain electrode 622, and a gate electrode 624 are formed. The gate electrode 624 may be formed by selective removal (e.g., by etching and/or lithography) of portions of at least the contact film 514 and the second barrier film 510 to form a third recessed region (not shown). An etch stop film (e.g., 112) may be used to facilitate control of etching processes to form the third recessed region. A gate dielectric (not shown) may be deposited into the third recessed region, and a material to form the gate electrode 624 may be deposited on the gate dielectric. The contact film 514 may be recessed to electrically insulate the gate electrode 624 from the contact film 514 or to reduce leakage from the gate electrode 624 to the contact film 514. Gate electrode 624 may be electrically insulated from conductive elements (e.g., the contact film 514) in a variety of ways including by an air spacer, an insulating material such as silicon oxide or silicon nitride, or a high-k dielectric to line the sidewalls of the contact film 514. Other gate control techniques and structures may be used in other embodiments. For example, the second barrier film 510 may operate as a Schottky junction for control of the quantum well channel 508.

An electrode material may be deposited to form the source electrode 620 and the drain electrode 622. A variety of suitable deposition techniques including chemical vapor deposition, sputtering, and/or epitaxial deposition techniques may be used to deposit the electrodes 620, 622, 624. Patterning techniques such as lithography and/or etch processes may be used to selectively deposit the electrode material. In an embodiment, electrode material for the source electrode 620, the drain electrode 622, and the gate electrode 624 is deposited during the same deposition operation. In other embodiments, one or more of the electrodes 620, 622, 624 are formed during separate deposition operations.

The order of formation of various structures described in connection with FIGS. 5 and 6 may occur in a different order. For example, the drain structure 618 may be formed prior to the source structure 516 in some embodiments. Other well-known semiconductor structures and/or process operations may be used in fabricating the manufacturing product 600c.

Figure 7:
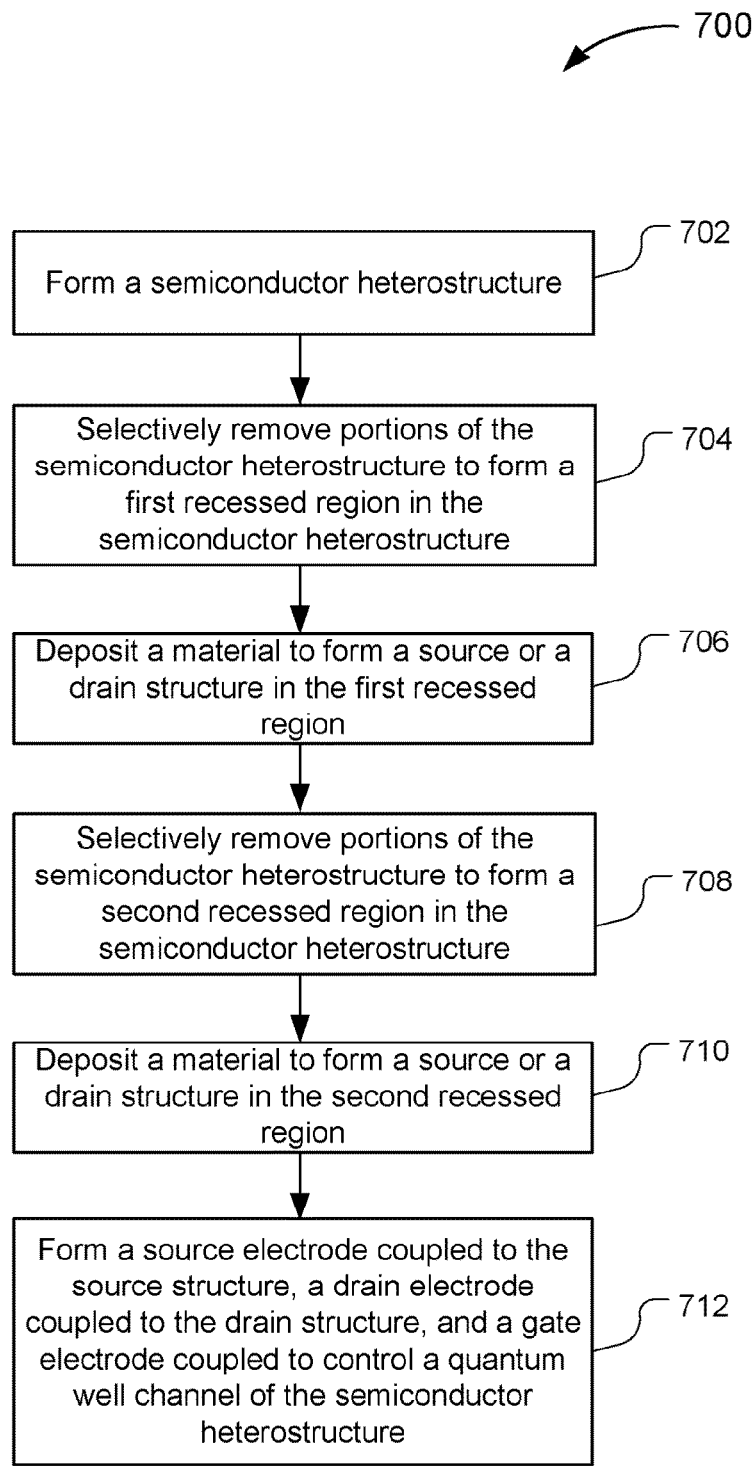
FIG. 7 is a flow diagram of a method for fabricating an integrated circuit in accordance with some embodiments.

FIG. 7 is a flow diagram of a method 700 for fabricating an integrated circuit (e.g., 100) in accordance with some embodiments. The method 700 includes forming a semiconductor heterostructure at block 702. The semiconductor heterostructure (e.g., 500a) can be formed according to a variety of techniques described herein. In an embodiment, the semiconductor heterostructure is formed by depositing a first barrier film on or over a semiconductor substrate, depositing a quantum well channel film on or over the first barrier film, depositing a second barrier film on or over the quantum well channel film, and depositing a contact film on or over the second barrier film. Other intervening films and/or structures may be deposited to form the semiconductor heterostructure. The films may be epitaxially deposited according to various embodiments.

At block 704, the method 700 further includes selectively removing portions of the semiconductor heterostructure to form a first recessed region in the semiconductor heterostructure. For example, portions of the contact film, the second barrier film and/or the quantum well channel may be selectively removed. The selective removal may be performed by etch and/or lithography processes.

At block 706, the method 700 further includes depositing a material to form a source or a drain structure in the first recessed region. At block 708, the method 700 further includes selectively removing portions of the semiconductor heterostructure to form a second recessed region in the semiconductor heterostructure. At block 710, the method 700 further includes depositing a material to form a source or a drain structure in the second recessed region. For example, if a material is deposited to form a source structure in the first recessed region at 706, then a material may be deposited to form a drain structure in the second region at 708.

At block 712, the method further includes forming a source electrode coupled to the source structure, a drain electrode coupled to the drain structure, and a gate electrode coupled to control a quantum well channel of the semiconductor heterostructure. Method 700 may include other techniques and configurations described in connection with FIGS. 1-6.

Figure 8:
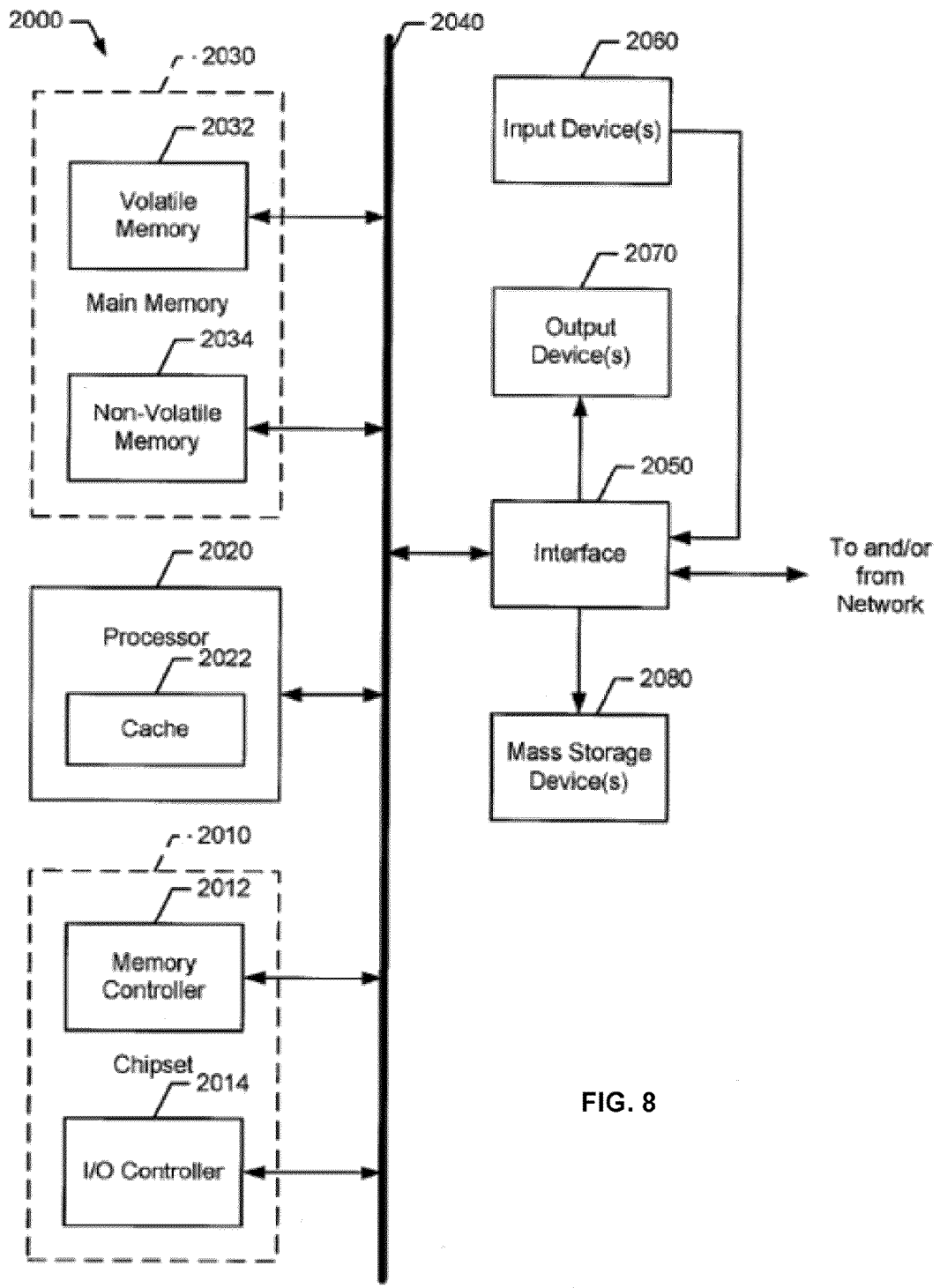
FIG. 8 schematically illustrates an example processor based system that may include an integrated circuit device as described herein in accordance with some embodiments.

FIG. 8 schematically illustrates an example processor based system 2000 that may include an integrated circuit device (e.g., 100) as described herein in accordance with some embodiments. The processor system 2000 may be a desktop computer, a laptop computer, a handheld computer, a tablet computer, a PDA, a server, an Internet appliance, and/or any other type of computing device.

The processor system 2000 illustrated in FIG. 8 includes a chipset 2010, which includes a memory controller 2012 and an input/output (I/O) controller 2014. The chipset 2010 may provide memory and I/O management functions as well as a plurality of general purpose and/or special purpose registers, timers, etc. that are accessible or used by a processor 2020. The processor 2020 may include a cache 2022, which may be implemented using a first-level unified cache (L1), a second-level unified cache (L2), a third-level unified cache (L3), and/or any other suitable structures to store data.

The memory controller 2012 may perform functions that enable the processor 2020 to access and communicate with a main memory 2030 including a volatile memory 2032 and a non-volatile memory 2034 via a bus 2040. While FIG. 8 shows a bus 2040 to communicatively couple various components to one another, other embodiments may include additional/alternative interfaces.

The volatile memory 2032 may be implemented by synchronous dynamic random access memory (SDRAM), dynamic random access memory (DRAM), RAMBUS dynamic random access memory (RDRAM), and/or any other type of random access memory device. The non-volatile memory 2034 may be implemented using flash memory, read only memory (ROM), electrically erasable programmable read only memory (EEPROM), and/or any other desired type of memory device.

The processor system 2000 may also include an interface circuit 2050 that is coupled to the bus 2040. The interface circuit 2050 may be implemented using any type of interface standard such as an Ethernet interface, a universal serial bus (USB), a third generation input/output interface (3GIO) interface, and/or any other suitable type of interface.

One or more input devices 2060 may be connected to the interface circuit 2050. The input device(s) 2060 permit an individual to enter data and commands into the processor 2020. For example, the input device(s) 2060 may be implemented by a keyboard, a mouse, a touch-sensitive display, a track pad, a track ball, an isopoint, and/or a voice recognition system.

One or more output devices 2070 may also be connected to the interface circuit 2050. For example, the output device(s) 2070 may be implemented by display devices (e.g., a light emitting display (LED), a liquid crystal display (LCD), a cathode ray tube (CRT) display, a printer and/or speakers). The interface circuit 2050 may include, among other things, a graphics driver card.

The processor system 2000 may also include one or more mass storage devices 2080 to store software and data. Examples of such mass storage device(s) 2080 include floppy disks and drives, hard disk drives, compact disks and drives, and digital versatile disks (DVD) and drives.

Access to the input device(s) 2060, the output device(s) 2070, the mass storage device(s) 2080 and/or the network may be controlled by the I/O controller 2014. In particular, the I/O controller 2014 may perform functions that enable the processor 2020 to communicate with the input device(s) 2060, the output device(s) 2070, the mass storage device(s) 2080 and/or the network via the bus 2040 and the interface circuit 2050.

While the components shown in FIG. 8 are depicted as separate blocks within the processor system 2000, the functions performed by some of these blocks may be integrated within a single semiconductor circuit or may be implemented using two or more separate integrated circuits. For example, although the memory controller 2012 and the I/O controller 2014 are depicted as separate blocks within the chipset 2010, the memory controller 2012 and the I/O controller 2014 may be integrated within a single semiconductor circuit.

According to various embodiments, the processor 2020, the main memory 2030, or the chipset 2010, or combinations thereof, may include one or more integrated circuit devices (e.g., 100) or transistors that include features described herein. The one or more integrated circuit devices may include, for example, horizontal field-effect transistors, or high electron mobility transistors (HEMT), or combinations thereof. The processor 2020, the main memory 2030, or the chipset 2010 may include a P-type metal-oxide-semiconductor (PMOS) device and/or an N-type metal-oxide-semiconductor (NMOS) device.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
   a semiconductor substrate;
   a quantum well channel coupled with the semiconductor substrate, the quantum well channel comprising a first material having a first bandgap energy; and
   a drain structure coupled with the quantum well channel, the drain structure comprising a second material having a second bandgap energy, wherein the second bandgap energy is less than the first bandgap energy.

2. The apparatus of claim 1, wherein the drain structure is epitaxially coupled with the quantum well channel to form a heterojunction between the drain structure and the quantum well channel.

3. The apparatus of claim 1, wherein the quantum well channel is a channel of a horizontal field-effect transistor.

4. The apparatus of claim 3, wherein the horizontal field-effect transistor is a high electron mobility transistor (HEMT).

5. The apparatus of claim 1, further comprising:
   a source structure coupled with the quantum well channel, the source structure comprising a third material having a third bandgap energy, wherein the third bandgap energy is greater than the first bandgap energy.

6. The apparatus of claim 1, further comprising:
   a first barrier film coupled with the semiconductor substrate and disposed between the semiconductor substrate and the quantum well channel.

7. The apparatus of claim 6, further comprising:
   a second barrier film coupled with the quantum well channel, wherein the quantum well channel is disposed between the first barrier film and the second barrier film and further disposed between the source structure and the drain structure.

8. The apparatus of claim 7, wherein:
   the first barrier film comprises a material having a bandgap energy that is greater than the first bandgap energy; and
   the second barrier film comprises a material having a bandgap energy that is greater than the first bandgap energy.

9. The apparatus of claim 7, further comprising:
   a contact film coupled with the second barrier film.

10. The apparatus of claim 9, further comprising:
    one or more buffer films epitaxially coupled with the semiconductor substrate, the first barrier film being epitaxially coupled with the one or more buffer films.

11. The apparatus of claim 10, wherein:
    the semiconductor substrate comprises silicon (Si),
    the one or more buffer films comprise gallium arsenide (GaAs), indium aluminum arsenide (InAlAs), or combinations thereof,
    the first barrier film comprises indium aluminum arsenide (InAlAs),
    the first material of the quantum well channel comprises indium gallium arsenide (InGaAs) or indium antimonide (InSb),
    the second material of the drain structure comprises indium gallium arsenide (InGaAs) or indium antimonide (InSb),
    the third material of the source structure comprises gallium arsenide (GaAs) or indium aluminum arsenide (InAlAs),
    the second barrier film comprises indium aluminum arsenide (InAlAs), and
    the contact film comprises indium gallium arsenide (InGaAs).

12. The apparatus of claim 1, wherein the quantum well channel comprises group III-V semiconductor or a group II-VI semiconductor.

13. A method comprising:
    forming a semiconductor heterostructure comprising:
      a semiconductor substrate, and
      a quantum well channel film coupled with the semiconductor substrate, the quantum well channel film comprising a first material having a first bandgap energy;
    selectively removing a portion of the quantum well channel film to form a first recessed region in the semiconductor heterostructure; and
    depositing a second material having a second bandgap energy to form a drain structure in the recessed region, wherein the second bandgap energy is less than the first bandgap energy.

14. The method of claim 13, wherein forming the semiconductor heterostructure further comprises:
    depositing a first barrier film on the semiconductor substrate;
    depositing a second barrier film on the quantum well channel film; and
    depositing a contact film on the second barrier film, wherein selectively removing further comprises selectively removing portions of at least the contact film and the second barrier film.

15. The method of claim 14, wherein forming the semiconductor heterostructure further comprises:
    epitaxially depositing a material having a bandgap energy that is greater than the first bandgap energy to form the first barrier film; and
    epitaxially depositing a material having a bandgap energy that is greater than the first bandgap energy to form the second barrier film.

16. The method of claim 13, further comprising:
    selectively removing another portion of the quantum well channel to form a second recessed region in the semiconductor heterostructure; and
    depositing a third material having a third bandgap energy to form a source structure in the second recessed region, wherein the third bandgap energy is equal to or less than the first bandgap energy.

17. The method of claim 16, wherein depositing the second material having the second bandgap energy and depositing the third material having the third bandgap energy is performed by molecular beam epitaxy (MBE), atomic film epitaxy (ALE), epitaxial growth, chemical beam epitaxy (CBE), metal-organic chemical vapor deposition (MOCVD), or combinations thereof.

18. A system comprising:
    a processor; and
    a memory device coupled with the processor, wherein the processor or the memory device comprise:
      a semiconductor substrate;

a quantum well channel coupled with the semiconductor substrate, the quantum well channel comprising a first material having a first bandgap energy; and a drain structure coupled with the quantum well channel, the drain structure comprising a second material having a second bandgap energy, wherein the second bandgap energy is less than the first bandgap energy.

19. The system of claim 18, further comprising:

a source structure coupled with the quantum well channel, the source structure comprising a third material having a third bandgap energy, wherein the third bandgap energy is greater than the first bandgap energy.

20. The system of claim 19, wherein:

the quantum well channel is a channel of a P-type transistor and/or an N-type transistor; and the quantum well channel, the source structure, and the drain structure comprise a group III-V semiconductor or a group II-VI semiconductor.

\* \* \* \* \*